(12) United States Patent
Ando et al.

(10) Patent No.: US 7,932,661 B2
(45) Date of Patent: Apr. 26, 2011

(54) PIEZOELECTRIC VIBRATOR FOR ULTRASONIC MOTOR

(75) Inventors: Koji Ando, Ishikawa (JP); Mikio Takimoto, Ishikawa (JP); Masahiro Takano, Ishikawa (JP); Ryuji Shintani, Ishikawa (JP)

(73) Assignees: Nikko Company, Ishikawa (JP); Ishikawa Prefectural Government, Ishikawa (JP)

( * ) Notice: Subject to any disclaimer, the term of this patent is extended or adjusted under 35 U.S.C. 154(b) by 202 days.

(21) Appl. No.: 12/236,381

(22) Filed: Sep. 23, 2008

(65) Prior Publication Data

US 2010/0072858 A1 Mar. 25, 2010

(51) Int. Cl.
*H01L 41/08* (2006.01)
(52) U.S. Cl. .............................. 310/323.16; 310/323.02
(58) Field of Classification Search ............. 310/323.16, 310/323.02
See application file for complete search history.

(56) References Cited

U.S. PATENT DOCUMENTS

| | | | | |
|---|---|---|---|---|
| 5,453,653 | A * | 9/1995 | Zumeris | 310/323.16 |
| 6,081,063 | A * | 6/2000 | Kasuga et al. | 310/323.02 |
| 6,218,769 | B1 | 4/2001 | Iino et al. | |
| 6,396,194 | B1 * | 5/2002 | Iino et al. | 310/323.16 |
| 6,658,376 | B1 * | 12/2003 | Wang et al. | 703/13 |
| 7,075,211 | B1 * | 7/2006 | Ganor et al. | 310/317 |
| 7,119,476 | B2 * | 10/2006 | Nagahama | 310/317 |
| 7,378,777 | B2 * | 5/2008 | Moteki et al. | 310/323.16 |
| 7,646,136 | B2 * | 1/2010 | Adachi et al. | 310/323.16 |
| 2004/0189155 | A1 | 9/2004 | Funakubo | |
| 2006/0238072 | A1 * | 10/2006 | Funakubo | 310/323.16 |
| 2009/0009657 | A1 * | 1/2009 | Kawai | 348/373 |
| 2010/0033587 | A1 * | 2/2010 | Yumiki | 348/220.1 |

FOREIGN PATENT DOCUMENTS

| | | |
|---|---|---|
| JP | 2722211 B2 | 11/1997 |
| JP | 2000-116162 A | 4/2000 |
| JP | 3311446 B2 | 5/2002 |
| JP | 2004-297951 A | 10/2004 |
| JP | 2005-12192 A | 1/2005 |
| JP | 2005-65358 A | 3/2005 |

OTHER PUBLICATIONS

Saigoh, H., Multilayer Piezoelectric Motor Using the First Longitudinal and the Second Bending Vibrations, Jpn. J.Appl. Phys. vol. 34 (1995) pp. 2760-2764.*

* cited by examiner

*Primary Examiner* — J. SanMartin
(74) *Attorney, Agent, or Firm* — Sughrue Mion, PLLC

(57) ABSTRACT

In the invention, each piezoelectric element for a vibrator for an ultrasonic motor has electrode regions for exciting stretching vibration and flexural vibration separately. Thus, the invention provides a vibrator for an ultrasonic motor, in which electrodes are provided for applying voltage to each of the polarized region, and further provides a stack-type piezoelectric vibrator for an ultrasonic motor, consisting of a stack of the said vibrators and having an extraction electrode pattern provided for short circuit with an external electrode. The vibrator of the invention has high controllability, especially in a fine movement region and is useful as a driving source in a positioning device, in which enhanced vibration efficiency can be obtained.

6 Claims, 8 Drawing Sheets

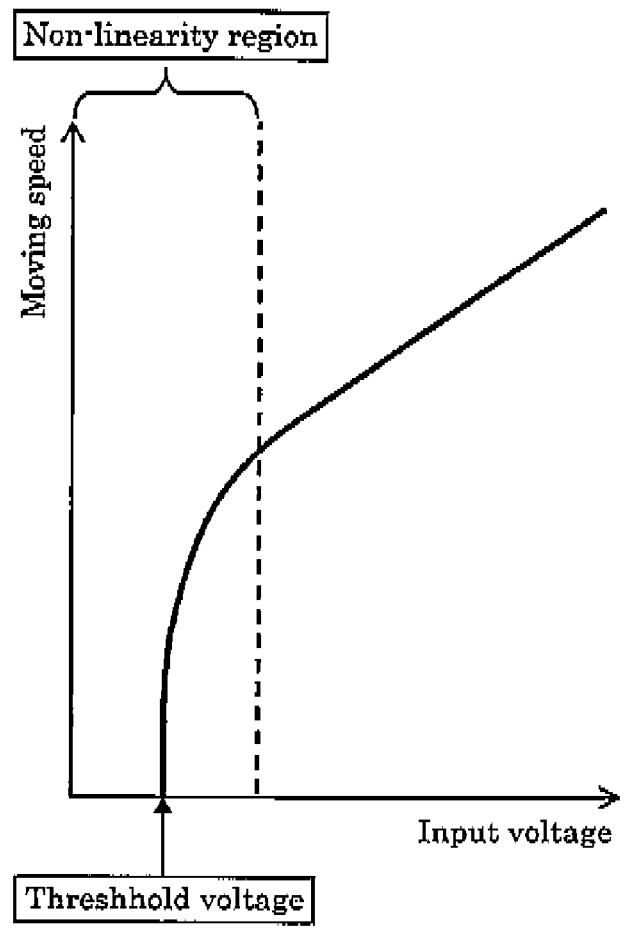

Fig.9
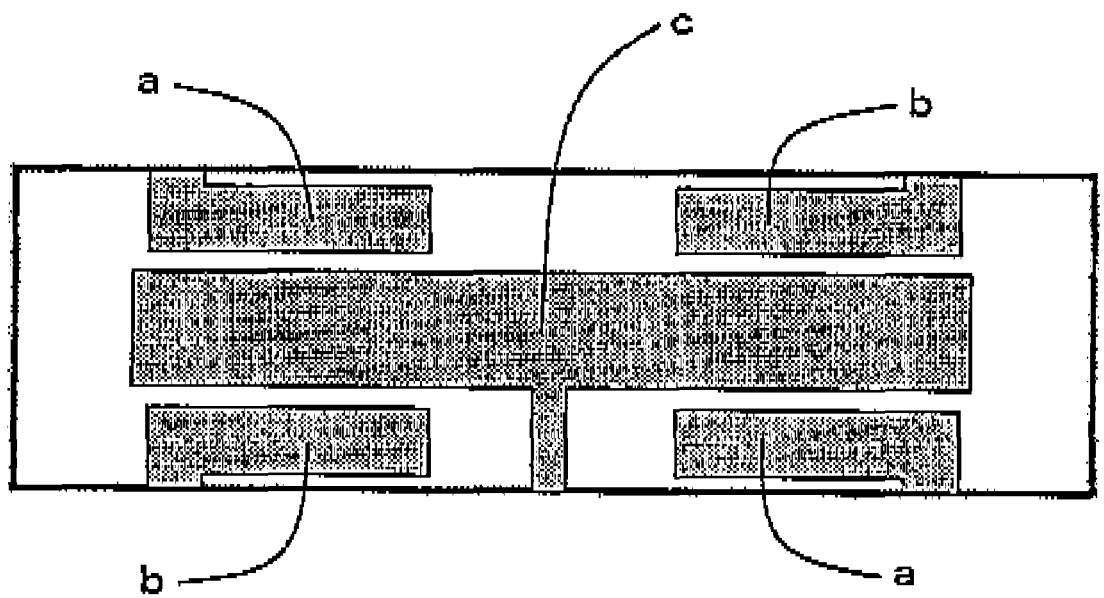
Fig.10
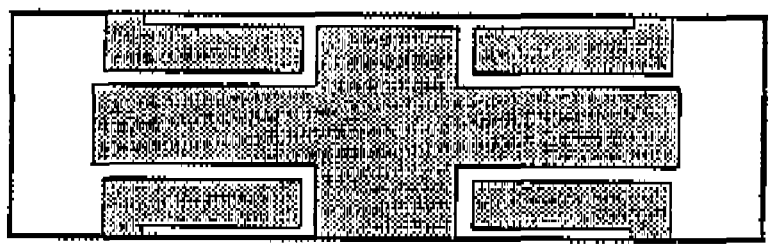
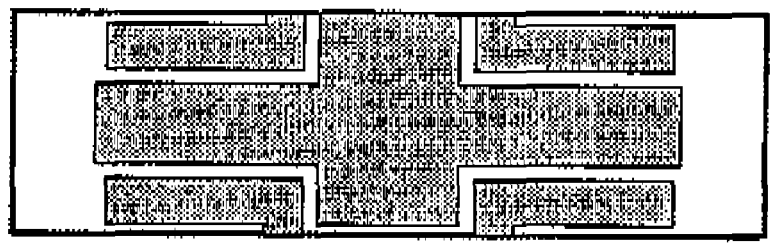

Ratio of the long side length of the polarized region to the long side length of the element[%]

Ratio of the long side length of the polarized region to the long side length of the element[%]

Ratio of the short side length of the polarized region to the short side length of the element[%]

PIEZOELECTRIC VIBRATOR FOR ULTRASONIC MOTOR

CROSS-REFERENCE TO RELATED APPLICATIONS

The present application encompasses the scope disclosed in the specification, claims, drawings and the abstract of Japanese patent application No. 2006-227479.

TECHNICAL FIELD

The invention relates to a vibrator for ultrasonic motors comprising a piezoelectric element.

BACKGROUND ART

With recent rapid developments in electronic and information industries, there have been keen demands for further miniaturization and high-integration in precision components, and super-precision positioning devices which can be used in nano-order ($10^{-9}$ m-order) inspection or processing are required. Also, with developments made in applied technologies in medicine and biotechnological researches on controlling proteins and cells, there is a keen demand for precise positioning in finer regions of microscopic stages. Moreover, recently, together with demands for higher-precision and downsizing in objects of inspections, processing and measurement, there have been demands for reduction in size and weight of positioning devices and drive sources thereof.

Conventionally, as drive sources of positioning device, electromagnetic motors have been used. A positioning device using an electromagnetic motor, however, has not only problems of various disadvantages attributable to the electromagnetic motor but also many other problems such as a structural problem that such a device requires a reduction gear and a ball screw. It is difficult to obtain nano-level precision by such a device. Furthermore, such a structural disadvantage inevitably makes the occupied volume and weight large. In a case of positioning using an electromagnetic-motor type device, the higher-precision limit in positioning is 1 μm ($1.0 \times 1.0^{-6}$ m) even when a device which is considered as having relatively high precision is used. This can be said to be 1000 times coarser as compared with nano-order precision required in the industrial market. That is, it is very unlikely that such a positioning device using an electromagnetic motor can achieve nano-order precision positioning.

As a new type positioning device, a positioning device using an ultrasonic motor as its drive source is expected to replace conventional electromagnetic motor-type devices. Such an ultrasonic motor-type positioning device uses a principle of action that ultrasonic oscillation is converted into friction, in which no reduction gear or ball screw is required. Further, such a device is expected to have excellent properties such as being reduced in size and weight, high responsiveness, no operating noise, and high retention at down time. Thus, technology using an ultrasonic motor as a drive source has been attracting attention as enabling provision of a positioning device of very high precision. Many types thereof have been proposed and studies have been made on such a technology.

The general principle of ultrasonic motor is shown in FIG. 2. The ultrasonic motor comprises vibrator 1 and slider 2 (dynamic body). At least one part of the vibrator makes an elliptic motion by combination of expansion, contraction and flexion. For example, point p (the center of the left end surface of the vibrator) in FIG. 2(A) goes through four states (a) to (d) to thereby describe a trajectory as shown in FIG. 2(B) (x is a longitudinal axis of the vibrator and y is an axis vertical to the top and bottom surfaces of the vibrator.) To the part of the vibrator making an elliptic motion, generally a wear-resistant material is adhered to serve as fixed sliding member 3 (stator). The elliptic motion of the vibrator is transmitted via the stator to a slider, to serve as power driving the slider. In FIG. 2, the dynamic body is transferred downwards along guide 4 shown in the figure by repeated elliptic motion. In this example, although the dynamic body is driven in a straight line, it is possible to make a rotary motion if a circular dynamic body is prepared.

As described later, the vibrator can consist of a piezoelectric element. In this case, the scale of the elliptic motion of the piezoelectric element depends on the input voltage. That is, as typically shown in FIG. 3 (corresponding to FIG. 2(B). In FIG. 3, y axis of FIG. 2(B) is shown as a horizontal direction), the larger the input voltage, the larger the scale of the elliptic motion and the higher the speed at which the slider moves. On the other hand, the smaller the input voltage, the smaller the scale of the elliptic motion and the lower the speed at which the slider moves. For example, in a case where an ultrasonic motor is used for precisely positioning on an X-Y table or the like, it is necessary to decrease the moving speed as getting close to a target position so that it can gradually get closer to the target. In order to decrease the moving speed, it is necessary to reduce the input voltage.

On the other hand, the reason why drive power can be transmitted via the fixed sliding member to the slider is that the two members contact with each other. For this purpose, the stator is pressed against the slider at an appropriate pressure. If the pressure is too strong, however, the stator is pressed against the slider so much that the two members can never separate from each other even for a moment and by weak input voltage, the motor does not work at all. (This corresponds to a state that there is no horizontal amplitude in the elliptic motion of FIG. 3. In a conventional vibrator, vertical amplitude also becomes zero in such a state.) When the input voltage is gradually increases, the vibrator suddenly starts to work at a certain voltage (threshold voltage), and in a region exceeding the threshold voltage, an elliptic motion begins to occur.

Even if the pressing force is reduced to the minimum, the threshold voltage only becomes low but does always exist. Therefore, it is difficult to prevent the behavior of such a sudden actuation at a certain voltage (threshold voltage). That is, the relation ship between the voltage and the moving speed does not have proportional characteristics in a low voltage region and in addition, it forms a very precipitous curve line as shown in FIG. 4. Even a small fluctuation in the voltage leads to a significant change in the moving speed (nonlinearity of input-output characteristics).

In this way, in a case where precise positioning is conducted by using an ultrasonic motor, it is necessary to make the input voltage low. For the nonlinearity of input-output characteristics, control is difficult in a fine movement region.

As examples of conventional vibrators for ultrasonic motors, Japanese Patent No. 3311446 and Japanese Patent Application Laid-Open No. 2004-297951 (US patent application publication No. 2004/189155) disclose mechanisms where by exciting a rectangular stacked-type piezoelectric element to simultaneously make two kinds of oscillation, expansion-contraction and flexion, an elliptic motion is allowed to occur at a certain part of the vibrating body, and the elliptic motion is transmitted to the dynamic body (slider) so that the dynamic body can make a rotary motion or straight motion.

In Japanese Patent Application Laid-Open No. 2000-116162 (U.S. Pat. No. 6,218,769) and Japanese Patent Application Laid-Open No. 2005-65358, by stacking piezoelectric elements for exciting second flexural vibration and piezoelectric elements for exciting first stretching vibration respectively, the vibrator is excited to cause an elliptic motion.

In conventional vibrators for ultrasonic motors, however, nonlinearity of input-output characteristic is not overcome. Therefore, controllability in a fine movement region is low, which results in difficulty in precise positioning.

Moreover, in conventional vibrators for ultrasonic motors, a piezoelectric element forms electrodes on almost the whole surface of both sides sandwiching a plate-like element, as typically shown in Japanese Patent No. 2722211. For this feature, there is a problem that capacitance becomes large and an unnecessarily large amount of current flows, which leads to large burden on a driving power source. Furthermore, in Japanese Patent Application Laid-Open No. 2000-116162 (U.S. Pat. No. 6,218,769) and Japanese Patent Application Laid-Open No. 2005-65358 where, piezoelectric elements for exciting second flexural vibration and piezoelectric elements for exciting first stretching vibration respectively are stacked separately, it means that one half of the whole vibrator body causes flexural vibration and the other half causes stretching vibration. For this feature, the proportion of excitation in the whole elements is small, which results in small vibration amplitude of the vibrator and low efficiency in excitation of vibration.

DISCLOSURE OF INVENTION

Problems to be Solved by Invention

The present invention is to provide a vibrator for an ultrasonic motor having high controllability (positioning accuracy) in a fine movement region and the one having high vibration efficiency that can be obtained by easing the nonlinearity of input/output characteristics.

Means for Solving the Problem

As a result of intensive studies with a view to solving the above problems, the present inventors have found out that by separately exciting flexural vibration (preferably secondary flexural vibration) and stretching vibration (preferably first stretching vibration) in the piezoelectric elements, controllability of the vibrator is significantly improved and that by optimizing positions and sizes of polarized regions for exciting the respective vibrations, vibration efficiency is enhanced, whereby completing the present invention.

That is, the present invention provides the vibrator for ultrasonic motors, as follows.

1. A vibrator for an ultrasonic motor, comprising polarized regions for separately exciting flexural vibration and stretching vibration in piezoelectric elements and an electrode provided for applying voltage signals to the polarized regions.
2. The vibrator for an ultrasonic motor according to 1, wherein each of the polarized regions of the piezoelectric elements for exciting flexural vibration and stretching vibration include the portion where warpage of the piezoelectric elements caused by vibration is greatest.
3. The vibrator for an ultrasonic motor according to 1 or 2, wherein flexural vibration is secondary flexural vibration and the stretching vibration is first stretching vibration.
4. The vibrator for an ultrasonic motor according to 3, wherein the piezoelectric elements are rectangular plates and the polarized region for exciting first stretching vibration is a rectangular or cross-shaped area fractionated by lines parallel to each side of the rectangular plate, which area is present in a region including midpoint between the long sides and between the short sides of the rectangular plate, in which each of the lines of the area parallel to the long sides of the rectangular plate has a length of 10 to 95% of the length of the long side and the each of the lines of the area parallel to the short sides of the rectangular plate has a length of 10% or more of the length of the short side.
5. The vibrator for an ultrasonic motor according to 3, wherein the piezoelectric elements are rectangular plates and the electrodes for exciting secondary flexural vibration is a pair of electrodes provided on both surfaces in a region closer to the center of the plate in the longitudinal direction by one-fourth of the length of the long side from the end, and each of the side lines of the polarized regions parallel to the long sides of the rectangular plate has a length of 40% or less of the long side and each of the side lines of the polarized regions parallel to the short sides of the rectangular plate has a length of 40% or less of the long side.
6. A stack-type piezoelectric vibrator for an ultrasonic motor, consisting of a stack of the vibrators according to any one of 1 to 5 above and having electrodes having an extraction electrode pattern provided for short circuit with an external electrode.

Effect of Invention

The vibrator for an ultrasonic motor according to the present invention, which is improved in controllability, as compared with the conventional ones, especially significantly improved in controllability in a fine movement region, is useful as a drive source for a precision-positioning device. Moreover, a vibrator for an ultrasonic motor having higher vibration efficiency than that of conventional vibrators can be obtained.

BEST MODE FOR CARRYING OUT THE INVENTION

In the vibrator for an ultrasonic motor comprising piezoelectric elements according to the present invention, electrodes are provided on one element such that flexural vibration (preferably secondary flexural vibration) and stretching vibration (preferably first stretching vibration) are separately excited, and that the arrangement of the electrodes are optimized. Here, (secondary) flexural vibration is lateral vibration (in the secondary vibration, one wavelength=the whole length of the vibrator) as typically shown in FIG. 6(a), and (first) stretching vibration is vertical vibration (in the first vibration, half wavelength=the whole length of the vibrator), also as typically shown in FIG. 6(b), Hereinbelow, the invention is described in detail.

Each point of excitation (position of electrode) of the piezoelectric element is set to be a position where warpage caused by each vibration is greatest, so that stretching vibration and flexural vibration can be efficiently excited. Specifically, for stretching vibration, the electrode is placed at the nodal point of the vibration, and for flexural vibration, the electrode is placed at the loop of the vibration.

For example, in a case where rectangular thin plate-shape piezoelectric elements are used, amplitude distribution of second flexural vibration is as shown in FIG. 7(a) Since second flexural vibration is lateral vibration where the whole length of the piezoelectric element corresponds to almost one wavelength (=vibration which has amplitude within the element surface), the point where warpage is greatest is a position where the amplitude is largest, and the point is at a distance of about one-fourth of the longitudinal length from the free right or left end. Actually, the entire length (L) of a piezoelectric element is slightly longer than one wavelength of second flexural vibration ($\lambda_{2B}$), and the point where warpage is greatest is (¼)L+α from the right or left end toward the center of the plate. In this calculation, α=(¼)(L−$\lambda_{2B}$). Generally, α is about 4.5 to 6.5% of L. Accordingly, in the present invention, the electrode for second flexural vibration is placed at this position.

Similarly, in a case where rectangular thin plate-shape piezoelectric elements are used, amplitude distribution of first stretching vibration is as shown in FIG. 7(b) Since first stretching vibration is axial vibration where the whole length of the piezoelectric element corresponds to almost half wavelength (=vibration which has amplitude in the longitudinal direction of the element), unlike the case of flexural vibration, the point where warpage is greatest is a position where displacement is the smallest, which is around the center of the element. Accordingly, in the present invention, the electrode for first stretching vibration is placed at this position.

In first stretching vibration and second flexural vibration, it is known that excitation efficiency of vibration can be indirectly evaluated by difference between resonance frequency (fs) and anti-resonance frequency (fp) (Δf=fp−fs). FIG. 12 shows changes in Δf for first stretching vibration, FIGS. 13 and 14 show for second flexural vibration, respectively, when the size of the polarized region is changed. In case of exciting first stretching vibration, it is understood that the Δf value is largest in first stretching vibration of the vibrator when the length of the long side of the polarized region parallel to the long side of the element is about 70%. When it exceeds 95%, the value significantly decreases. Presumably from these results, it is preferred that the long side of the polarized region for exciting first stretching vibration be 95% or less of the long side of the element. On the other hand, when it is 55% or less, the Δf value markedly decreases. Since first stretching vibration is auxiliary vibration the main purpose of which is to separate the stator and the slider, the advantage of power saving brought by a smaller electrode area has a priority over the disadvantage of reduction in excitation efficiency in many cases. For this reason, as for the polarized region for exciting first stretching vibration, it is preferable that the long side length be 10% or more of the long side of the element. If vibration efficiency is prioritized in the design, the preferred length of the long side of the region is 55% or more. The maximum of the short side of the polarized region for exciting first stretching vibration is limited by the polarized region for exciting second flexural vibration. As for the minimum value of the short side, 10% or more of the short side of the element will satisfy necessary and sufficient conditions, based on the same reason in the case of the long side length.

In case of exciting second flexural vibration, it is understood that the Δf value is largest in second flexural vibration of the vibrator when the length of the short side of each polarized region is about 30% of the short side of the element. When it exceeds 40% or becomes 20% or less, the Δf value significantly decreases. Also, the Δf value is largest in second flexural vibration of the vibrator when the length of the long side of each polarized region is about 30% of the long side of the element. When it exceeds 40% or becomes 20% or less, the Δf value significantly decreases.

In examining the warpage distribution in second flexural vibration through finite element analysis, warpage concentrates locally in a region at a distance of one-fourth of the long side length of the element in the inward direction along the longitudinal direction from the short side end. Therefore, by exciting vibration locally, vibration efficiency is assumed to decrease to some extent but necessary and sufficient amplitude can be obtained. Since second flexural vibration plays the leading role of controlling the moving speed of the slider and driving force, the higher the excitation efficiency, the more preferred in many cases. There are, however, many demands for reduction in power consumption. That is, for the purpose of reducing power consumption, a necessary and sufficient polarized region for exciting vibration may be provided at a local point where warpage concentrates. For this reason, as a polarized region for exciting second flexural vibration, it is preferred that the short side length of each polarized region be 40% or less and that the long side length be 40% or less of the long side length of the element. Here, the lower limits of the long and short side length of the polarized regions vary depending on conditions such as shape and target properties. The lower limits should be larger than the minimum value which is determined to be effective by finite element analysis or the like. For example, the lower limits are 1% or more of the short and long side lengths respectively, preferably the lower limit of the short side length is 3% or more of the short side length of the element, more preferably 5% or more, and preferably the lower limit of the long side length is 10% or more of the long side length of the element, more preferably 20% or more.

Hereinbelow, first stretching vibration and second flexural vibration are explained as an example. Combinations with other vibration modes may be employed as long as stretching vibration and flexural vibration are separately excited. In higher modes, however, absolute values of amplitude generally, tend to be small, which makes it difficult to excite stretching vibration and flexural vibration separately and also makes electrode arrangement complicated. Therefore, the combination of first stretching vibration and second flexural vibration is preferred. In the following example, arrangement of polarized regions formed by sides parallel to four sides of a rectangular thin-plate shape piezoelectric element having almost uniform thickness is explained. There is, however, no limitation on the shape of a polarized region as long as the shape can allow the separately-excited stretching vibration and flexural vibration to occur at a local point where warparge is greatest in each of the vibrations. The present invention includes a vibrator having polarized regions at positions determined by appropriate analysis and an electrode for applying electric signals.

The basic configuration of electrode arrangement on a piezoelectric element in the vibrator for an ultrasonic motor according to the present invention is shown in FIG. 1.

As shown in FIG. 1, electrodes includes an electrode for first stretching vibration (c in the Figure) and electrodes for second flexural vibration (a and b in the Figure).

The electrodes for first stretching vibration are provided on both surfaces of the polarized region for exciting first stretching vibration, that is, which surfaces include at least part of the center line comprising midpoints between the long sides of the piezoelectric element(rectangular plate) Although not shown in the Figure, a counter electrode of electrode c is present on the rear surface of the element and by applying alternate voltage between the electrodes, first stretching vibration is excited.

The electrode region for exciting stretching vibration is shown as a cross-shape region in FIG. 1. The region, however, may have an arbitrary shape as long as it includes a midpoint on the center line. For example, it may be polygonal, circular or oval. Preferred shapes of the region other than the cross shape shown in FIG. 1 are rectangular shapes formed by sides parallel to sides of the piezoelectric element (rectangular plate). Also, for short circuit to the side surface of the piezoelectric element, one side of the polarized region may be allowed to contact the side surface of the element, as shown in FIGS. 1 and 8, or a part leading to the side surface may be provided as shown in FIG. 9. Here, it is preferable to give sufficient consideration on arrangement of electrode regions, disposition of an external electrode and terminals and structures in providing the leading part so that interference between these components and suppression in vibrations by electrodes can be minimized.

In the present invention, it is preferable that the side length of the polarized region parallel to the long side of the rectangular plate be within to 95% of the long side length of the element. Even if the length is 10% or less, stretching vibration can be excited but unsatisfactorily. On the other hand, excitation efficiency cannot be enhanced even if voltage is applied to an area including regions apart from the aforementioned midpoint, which rather leads to increases in capacitance and reduction in amplitude by electrodes. Therefore, as specifically shown in FIG. 7, in a case where the electrode is formed into a rectangular shape to use almost the whole width of the piezoelectric element, the length of the side parallel to the long side of the element is preferably 95% or less, more preferably 85% or less.

Further, it is preferable that the length of the side parallel to the short side of the rectangular plate be 10% or more of the short side of the element. If the length is less than 10%, the area of the polarized region becomes too small to conduct sufficient excitation of vibration.

Electrodes for first stretching vibration are provided on both of front and rear surfaces of the polarized region on the element.

As shown in FIG. 1, electrodes for second flexural vibration (a and b in the Figure) are provided as two pairs of electrodes on both of front and rear surfaces of the polarized region for exciting second flexural vibration, i.e., in a region apart by one-fourth of the long side length along the longitudinal direction inward from the short side end of the piezoelectric element. Here, each pair of electrodes is provided such that the electrodes are symmetrical with respect to the midpoint. Although not shown in the Figure, counter electrodes for electrodes a and b are present on the rear surface respectively, and by applying alternate voltage in opposite phase to electrodes a and b, second flexural vibration is excited.

Electrodes a and b may be provided such that sufficient insulation can be ensured between a and b or between a, b and c. It is preferable that a distance of 0.2 to 0.5 mm be provided between electrodes a or b and electrode c in order to secure sufficient electric insulation In a case where the vibrator of the present invention is used in an ultrasonic motor, a large amount of alternate voltage is applied to electrodes and b and electrode c if fast movement is desired. In a region where fine movement is required, normal voltage is applied to electrode c and weaker voltage is applied to electrodes a and b. In this manner, a vibration state enabling fine regulation can be obtained. Comparison between an elliptic motion made by a conventional vibrator and the elliptic motion made by the vibrator of the present invention is shown in FIG. 5. The vibrator of the present invention, which can excite each vibration mode separately, can excite sufficient vibration only for applying pressure to the dynamic body in advance and then further excite weak vibration for the transmission direction. For this advantage, the present invention can obtain relatively linear characteristics in low-voltage region and can ease precipitous characteristics after exceeding a threshold voltage, whereby enhancing controllability in fine movement region.

Each of the electrodes may have a lead part for applying voltage appropriately. Alternatively, a flexible substrate with an electrode may be bonded to the piezoelectric element plate.

Also, the vibrator for an ultrasonic motor is not limited to a single-layer vibrator and may be a stack of the above vibrators. In the present invention, regions for exciting flexural vibration and stretching vibration are provided on all layers of the piezoelectric body. For this, the proportion of the regions exciting vibration in the whole vibrator is increased, whereby a vibrator with excellent vibration efficiency can be obtained.

Materials used for piezoelectric elements and electrodes, methods for providing electrodes on the vibrator, and methods for forming a stacked body used in the present invention include all materials and all methods that can be used in this technical field. In Examples described later, lead zirconate titanate (PZT) was used as material for the piezoelectric element. Other piezoelectric materials, however, such as inorganic ones including lithium niobate ($LiNbO_3$), lithium tantalite ($LiTaO_3$), lithium tetraborate ($Li_2B_4O_7$), langasite ($La_3Ga_5SiO_{14}$) and aluminum nitride, and organic ones including poly(vinylidene fluoride), may be employed. In Examples described later, silver-palladium alloy was used as electrode material. Other electrode materials such as copper, silver, gold, aluminum, platinum, palladium and alloys containing these metals may be used. Examples of method for providing electrode include coating or printing of electroconductive paste, plating and deposition.

Examples of method for forming a stacked body include a method in which a slurry containing a piezoelectric element material and a binder is formed into a sheet and dried, then two kinds of electrode (inner electrode) patterns which are different in the positions of the extraction electrode for short circuit to the side surface of the piezoelectric element are provided on the sheet as shown in FIG. 10, such sheets are stacked in the order as shown in FIG. 11 and calcined, and an external electrode is provided. In FIG. 15, a stack-type vibrator in which external electrodes 7a, 7b, 8a and 8b are in short-circuit with inner electrodes of respective piezoelectric bodies every two layers. The present invention is, however, not limited to the above examples, and other materials and methods may be employed to produce the vibrator of the present invention.

In the present Specification, the term "ultrasonic motor" includes all motors in which at least part of a vibrator makes an elliptic motion by piezoelectric mechanism, to thereby drive other members in the motor. The vibration frequency does not necessarily have to be in ultrasonic region and there is no limitation on the vibration frequency as long as it functions as a drive source.

EXAMPLES

Example 1

A rectangular piezoelectric element plate of 2 mm in thickness×30 mm in length×8.4 mm in width was prepared. The electrode regions for exciting first stretching vibration and for exciting second flexural vibration were provided according to the shapes and arrangement according to FIG. 1. The electrode for exciting first stretching vibration was a cross shape of length 20 mm, which occupied 41% of the piezoelectric element area. Each of the electrodes for exciting second flexural vibration had length of 6 mm and width of 1.5 mm and the two pairs of electrodes occupied 14% of the piezoelectric element area. On the center of the short side, a stator was attached.

The results of measurements on vibration states of a stator attached to the end of piezoelectric vibrator are shown in FIG. 16. In the phase difference of 180 degrees, $100V_{p-p}$–55.2 KHz alternate voltage was applied to electrodes a and b. At the same time, to electrode c, alternate voltage of $100V_{p-p}$ with the same frequency was applied as a signal different in phases from signals for electrodes a and b. The phase difference between electrode c and electrodes a and b was adjusted such that 90-degree phase difference is caused in vibration phase of end parts. As a result, the stator provided on the center of the short side was confirmed to make an elliptic motion as shown in FIG. 16. For the purpose of examining how much contribution electrodes a and b and electrode c make to first stretching vibration, the amplitude of voltage applied to electrodes a and b was reduced to 25 $V_{p-p}$. The major axis in the elliptic motion of the stator changed little (almost no change), but the minor axis was decreased to 25%. Therefore, it was confirmed that the movements could be controlled independently in very delicate manner.

Example 2

A rectangular piezoelectric element plate of 2 mm in thickness×30 mm in length×8.4 mm in width was prepared. The electrode regions for exciting first stretching vibration and for exciting second flexural vibration were provided according to the shapes and arrangement according to FIG. 8. The electrode for first stretching vibration was a 6 mm-long rectangle which occupied 19% of the piezoelectric element area. Each of the electrodes for second flexural vibration was 6 mm long and 1.5 mm wide and the two pairs of the electrodes occupied 14% of the piezoelectric element area. In the same manner as in Example 1, on the center of the short side, a stator was attached.

Voltage was applied to each of the electrodes in the same manner as in Example 1, and differences in measurement results from Example 1 are mainly described below. In the measurement results, a significant decrease in amplitude of first stretching vibration due to reduction in the polarized region size to 20% of the long side length of the element was observed. The stator provided on the center of the short side was confirmed to make an elliptic motion. For the purpose of examining how much contribution electrodes a and b and electrode c make to first stretching vibrations the amplitude of voltage applied to electrodes a and b was reduced to 25 $V_{p-p}$. The major axis in the elliptic motion of the stator changed little (almost no change), but the minor axis was decreased to 25%. Therefore, it was confirmed as in Example 1 that the movements could be controlled independently in very delicate manner.

Example 3

A rectangular piezoelectric element plate of 2 mm in thickness×30 mm in length×8.4 mm in width was prepared. The electrode regions for exciting first stretching vibration and for exciting second flexural vibration were provided according to the shapes and arrangement according to FIG. 9. The electrode for first stretching vibration was a 20 mm-long rectangle which occupied 29% of the piezoelectric element area. Each of the electrodes for second flexural vibration was 6 mm long and 1.5 mm wide and the two pairs of the electrodes occupied 14% of the piezoelectric element area, as in Example 1. In the same manner as in Example 1, on the center of the short side, a stator was attached.

Voltage was applied to each of the electrodes in the same manner as in Example 1, and differences in measurement results from Examples 1 and 2 are mainly described below. In the measurement results, it was observed that the amplitude of first stretching vibration became a little smaller than that of Example 1 and significantly larger than that of Example 2, due to differences in the size of the polarized region for first stretching vibration which was smaller than that of Example 1 and larger than that of Example 1. The stator provided on the center of the short side was confirmed to make an elliptic motion. For the purpose of examining how much contribution electrodes a and b and electrode c make to first stretching vibration, the amplitude of voltage applied to electrodes a and b was reduced to 25 $V_{p-p}$. The major axis in the elliptic motion of the stator changed little (almost no change), but the minor axis was decreased to 25%. Therefore, it was confirmed as in Example 1 that the movements could be controlled independently in very delicate manner.

Example 4

Stacked-type vibrators for ultrasonic motors, each comprising electrode arrangement described in one of Examples 1 to 3, wherein 35 sheets of 0.08 mm-thick piezoelectric elements are stacked, were prepared. Vibration states were evaluated in the same manner as in Examples 1 to 3. Due to reduction in thickness of one piezoelectric body layer, voltage required to obtain the same level of amplitude as in Examples 1 to 3 was significantly reduced, and by applying voltage of about 5 $V_{p-p}$, the amplitude of the same level could be obtained. By applying the voltage, the vibration state was evaluated. In this measurement, the stator provided on the center of the short side was confirmed to make an elliptic motion. For the purpose of examining how much contribution electrodes a and b and electrode c make to first stretching vibration, the amplitude of voltage applied to electrodes a and b was reduced to 1 $V_{p-p}$. The major axis in the elliptic motion of the stator changed little (almost no change), but the minor axis was decreased to 20%. Therefore, it was confirmed as in Examples 1 to 3 that the movements could be controlled independently in very delicate manner.

INDUSTRIAL APPLICABILITY

In the present invention, by employing optimal arrangement of electrodes on the piezoelectric element, the amplitude in the transmission direction (lateral amplitude in the elliptic motion shown in FIG. 3) and the amplitude in the voltage-application direction (vertical amplitude in the elliptic motion shown in FIG. 3) can be controlled separately. For this advantage, the present invention can be widely used as a drive source in a so-called "ultrasonic motor"

BRIEF DESCRIPTION OF DRAWINGS

[FIG. 4] A typical view showing relationship between input voltage and moving speed.

[FIG. 5] A typical view showing comparison in elliptic motions between a conventional vibrator and the vibrator of the present invention.

[FIG. 9] A plane view showing still another example of electrode arrangement on the piezoelectric element in the vibrator for an ultrasonic motors according to the present invention.

[FIG. 10] A plane view showing a pattern for the position of an extraction electrode used for short circuit to the side surface of the piezoelectric element.

Figure 1:
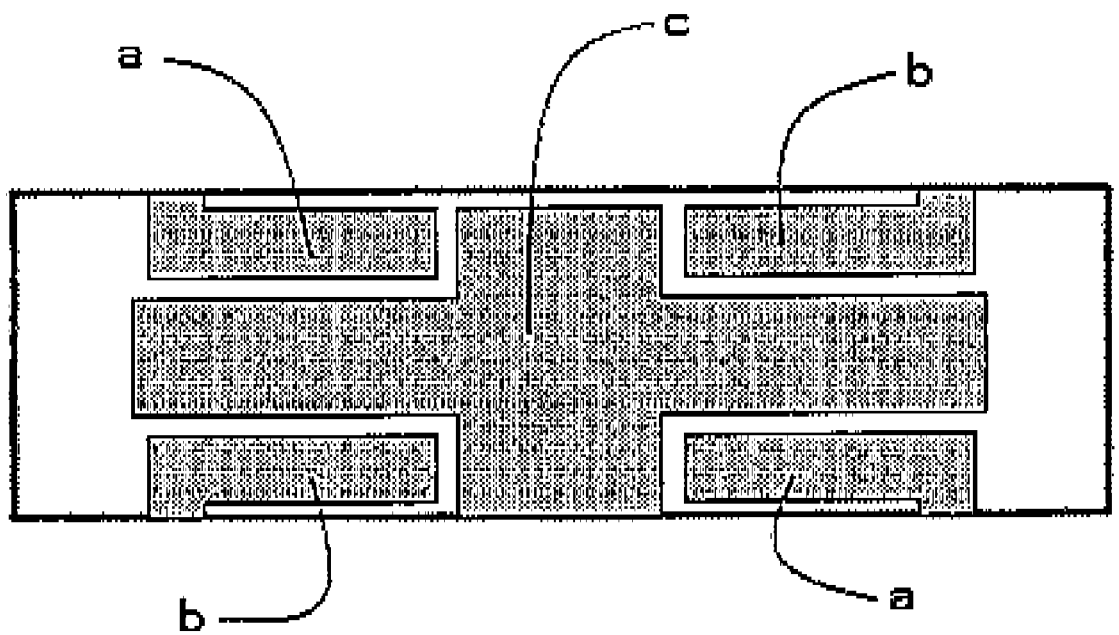
[FIG. 1] A plane view showing one example of electrode arrangement on the piezoelectric element in the vibrator for an ultrasonic motors according to the present invention.
Figure 2:
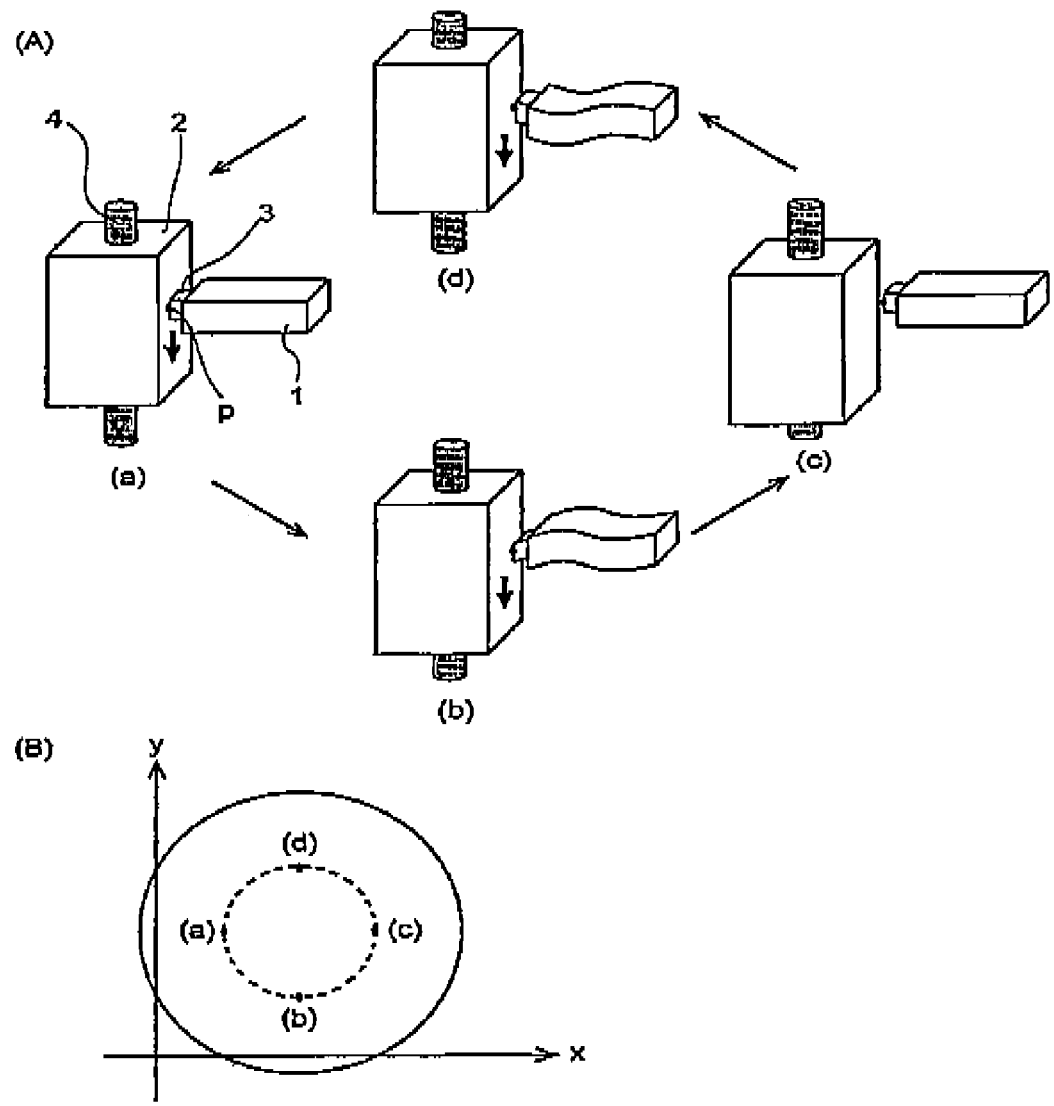
[FIG. 2] A typical view showing the general principle of an ultrasonic motor.
Figure 3:
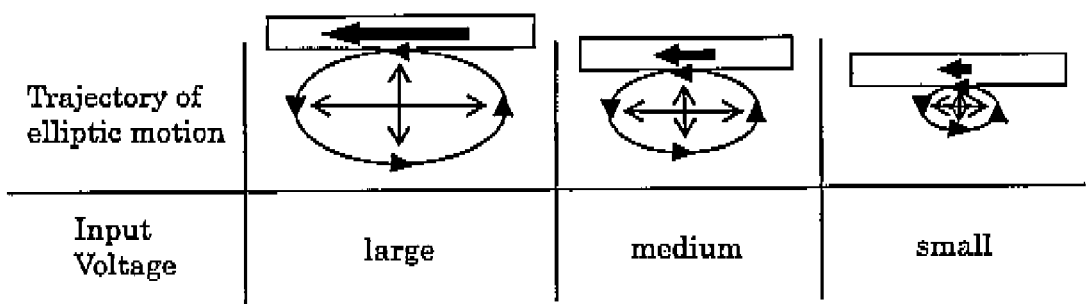
[FIG. 3] A typical view showing relationship between an elliptic motion of a vibrator and input voltage.
Figure 6:
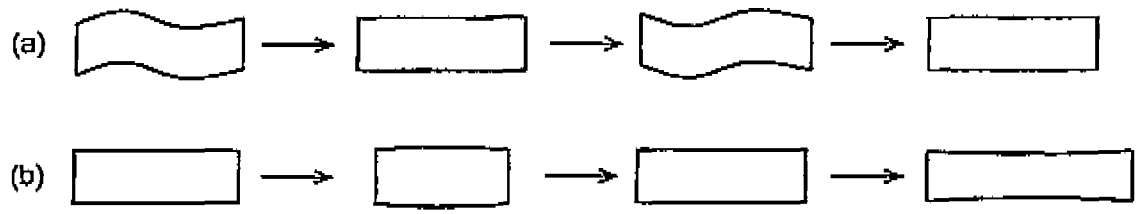
[FIG. 6] A typical view showing second flexural vibration (a) and first stretching vibration (b).
Figure 7:
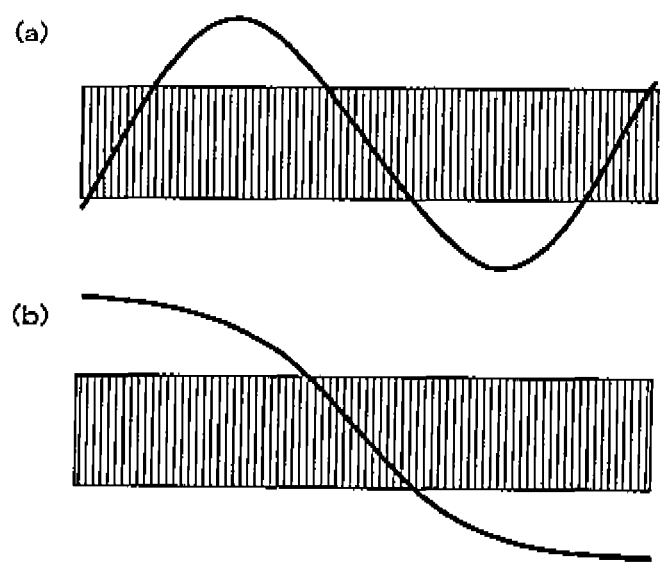
[FIG. 7] A typical view showing amplitude distributions in second flexural vibration (a) and stretching vibration (b).
Figure 8:
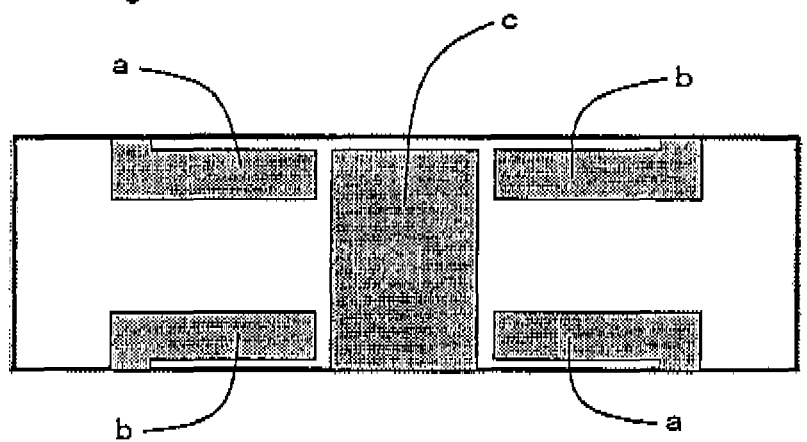
[FIG. 8] A plane view showing another example of electrode arrangement on the piezoelectric element in the vibrator for an ultrasonic motors according to the present invention.
Figure 11:
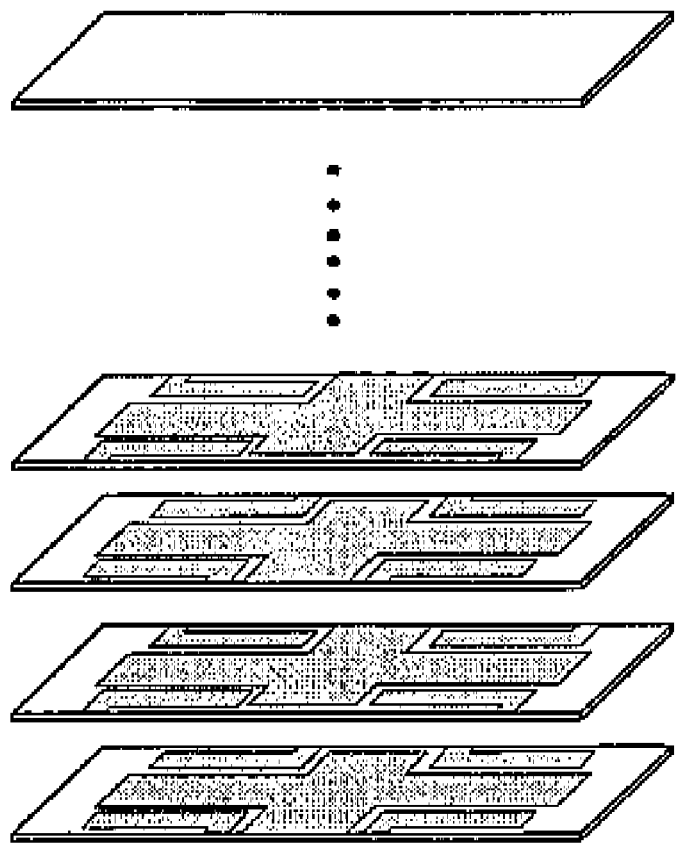
[FIG. 11] A view showing the stacking sequence in a stacked-type vibrator for an ultrasonic motor.
Figure 12:
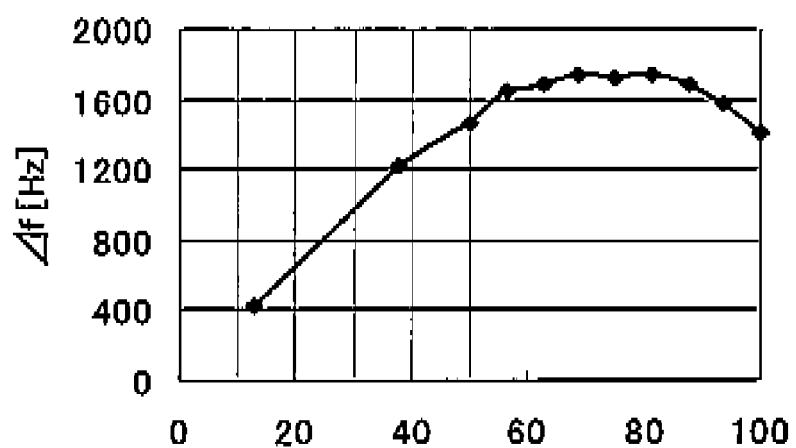
[FIG. 12] A chart showing relationship between the length of the polarized region for first stretching vibration and excitation efficiency.
Figure 13:
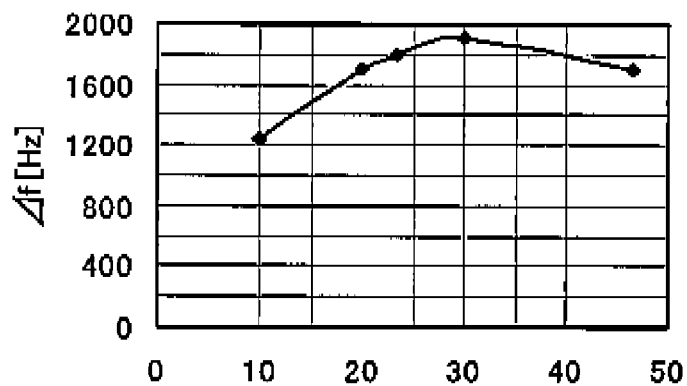
[FIG. 13] A chart showing relationship between the length of (the long side of) the polarized region for second flexural vibration and excitation efficiency.
Figure 14:
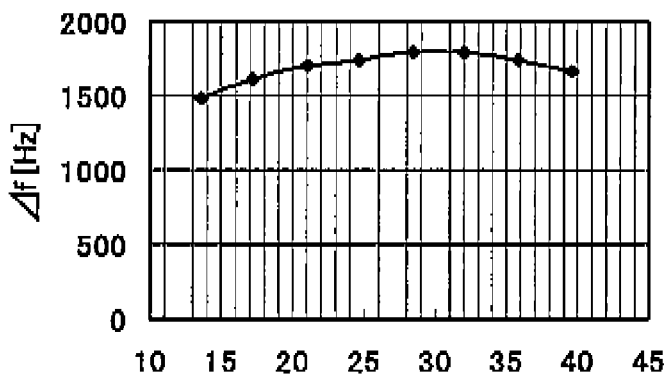
[FIG. 14] A chart showing relationship between the length of (the short side of) the polarized region for second flexural vibration and excitation efficiency.
Figure 15:
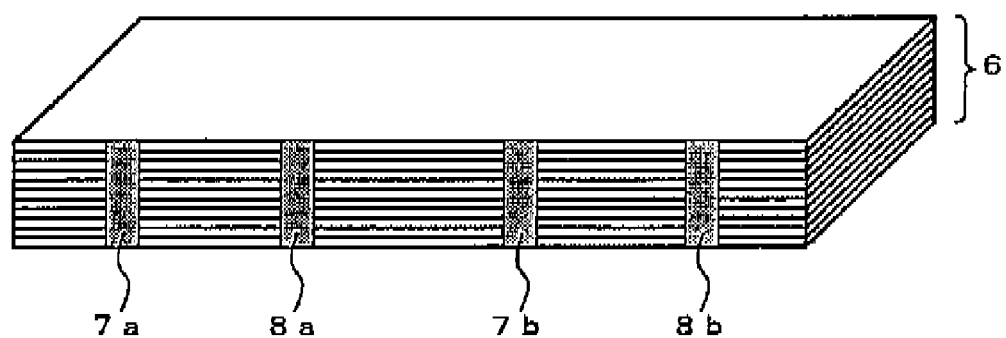
[FIG. 15] A view showing a multi-layer piezoelectric vibrator for an ultrasonic motors.
Figure 16:
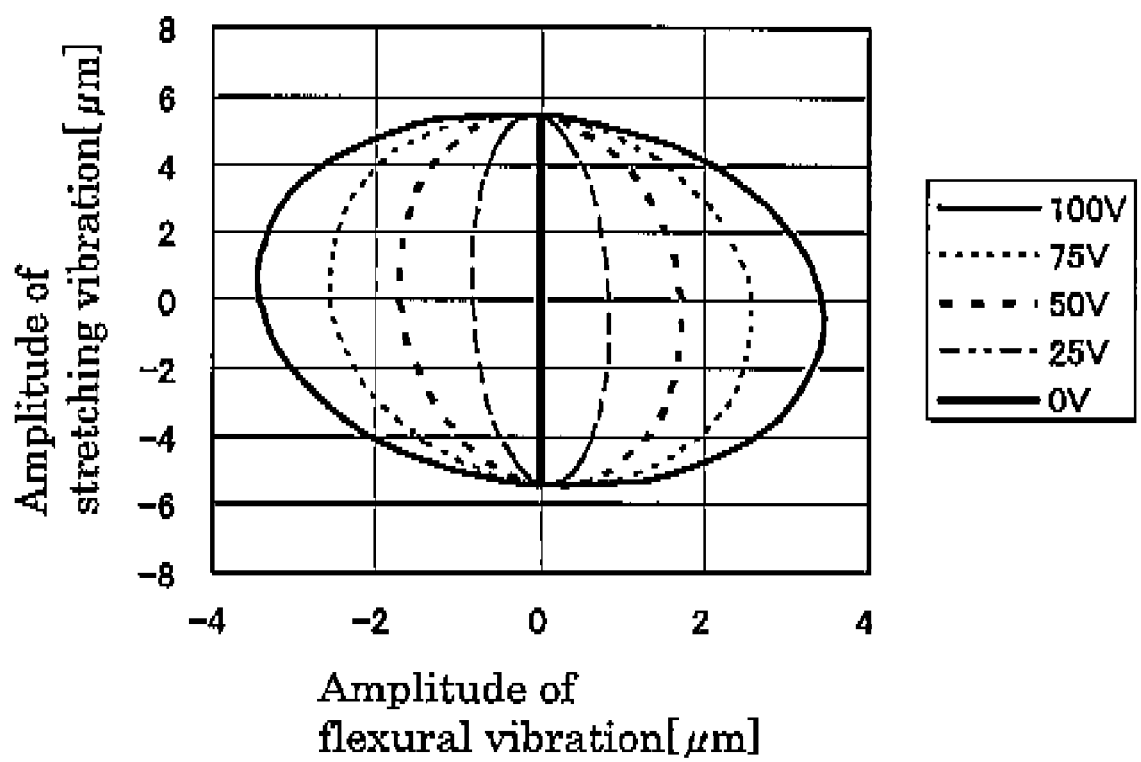
[FIG. 16] A view showing the vibration state of the stator when amplitude of applied voltage was changed.

EXPLANATIONS OF SYMBOLS a Electrode for second flexural vibration
b Electrode for second flexural vibration
c Electrode for first stretching vibration
1 Vibrator
2 Slider
3 Fixed sliding member (stator)
4 Guide
p Center point on the left end surface of the vibrator
6 Stacked-type vibrator
7a 7b External electrode
8a 8b External electrode

What is claimed is:

1. A vibrator for an ultrasonic motor, comprising:
    polarized regions for separately exciting flexural vibration and stretching vibration; and
    first and second electrodes configured to excite the flexural and the stretching vibration, respectively, wherein the first electrode and the second electrode are disposed on a same surface of a piezoelectric element for applying voltage signals to the polarized regions.

2. The vibrator for an ultrasonic motor according to claim 1, wherein each of the polarized regions of the piezoelectric elements for exciting flexural vibration and stretching vibration include the portion where warpage of the piezoelectric element caused by vibration is greatest.

3. The vibrator for an ultrasonic motor according to claim 1, wherein flexural vibration is secondary flexural vibration and the stretching vibration is first stretching vibration.

4. The vibrator for an ultrasonic motor according to claim 3, wherein the piezoelectric element is a rectangular plate and the polarized region for exciting first stretching vibration is a rectangular or cross-shaped area fractionated by lines parallel to each side of the rectangular plate, which area is present in a region including a midpoint between the long sides and between the short sides of the rectangular plate, in which each of the lines of the area parallel to the long sides of the rectangular plate has a length of 10 to 95% of the length of the long side and the each of the lines of the area parallel to the short sides of the rectangular plate has a length of 10% or more of the length of the short side.

5. The vibrator for an ultrasonic motor according to claim 3, further comprising a third electrode,
    wherein the piezoelectric element is a rectangular plate and the second electrode and the third electrode are configured to excite the secondary flexural vibration, the second and third electrode are provided on both surfaces in a region closer to the center of the plate in the longitudinal direction by one-fourth of the length of the long side from the end, and each of the side lines of the polarized regions parallel to the long sides of the rectangular plate has a length of 40% or less of the long side and each of the side lines of the polarized regions parallel to the short sides of the rectangular plate has a length of 40% or less of the long side.

6. A stack-type piezoelectric vibrator for an ultrasonic motor, consisting of a stack of the vibrators according to claim 1 above and having electrodes having an extraction electrode pattern provided for short circuit with an external electrode.

\* \* \* \* \*